United States Patent
Jacquet

(10) Patent No.: US 7,447,074 B2
(45) Date of Patent: Nov. 4, 2008

(54) READ-ONLY MEMORY

(75) Inventor: François Jacquet, Froges (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 11/481,576

(22) Filed: Jul. 5, 2006

(65) Prior Publication Data
US 2007/0064467 A1    Mar. 22, 2007

(30) Foreign Application Priority Data
Jul. 5, 2005    (FR) .................................. 05 52045

(51) Int. Cl.
*G11C 11/34* (2006.01)
(52) U.S. Cl. .................................. 365/185.17; 365/104
(58) Field of Classification Search ............ 365/185.17, 365/104
See application file for complete search history.

(56) References Cited

U.S. PATENT DOCUMENTS

| | | | |
|---|---|---|---|
| 4,193,125 A | 3/1980 | Moriya ......................... | 365/104 |
| 5,732,010 A | 3/1998 | Takashima et al. ............. | 365/63 |
| 6,363,001 B1 | 3/2002 | Borot et al. .................. | 365/104 |
| 6,556,468 B2 | 4/2003 | Garg ........................... | 365/104 |
| 7,057,916 B2* | 6/2006 | Ferrant ........................ | 365/94 |
| 2002/0044493 A1 | 4/2002 | Bohm et al. ............ | 365/230.02 |
| 2003/0063505 A1 | 4/2003 | Ferrant et al. ................ | 365/200 |
| 2003/0117851 A1* | 6/2003 | Lee et al. ................ | 365/185.17 |
| 2004/0130948 A1* | 7/2004 | Rolandi ................. | 365/185.05 |
| 2004/0141402 A1* | 7/2004 | Kim ........................ | 365/230.08 |
| 2005/0078521 A1* | 4/2005 | Chen et al. ............. | 365/185.18 |
| 2006/0140007 A1* | 6/2006 | Cernea et al. ........... | 365/185.21 |
| 2007/0025150 A9* | 2/2007 | Lee ........................ | 365/185.11 |

FOREIGN PATENT DOCUMENTS

| | | |
|---|---|---|
| EP | 1 271 552 | 1/2003 |
| EP | 1 475 805 | 11/2004 |

* cited by examiner

*Primary Examiner*—Michael T Tran
(74) *Attorney, Agent, or Firm*—Lisa K. Jorgenson; E. Russell Tarleton; Seed IP Law Group PLLC

(57) ABSTRACT

An array of ROM cells, each formed of a transistor having a first drain or source region connected to a bit line connecting several transistors in a first direction, the gates of the different transistors being connected to word lines in a second direction perpendicular to the first one, the array comprising a repetition of an elementary pattern extending over three lines in each direction and comprising nine transistors arranged so that each of the lines of the elementary pattern comprises two cells, two neighboring transistors of each pattern in the first direction sharing a same second region connected to a ground line and being connected to different bit lines from a word line to the other.

24 Claims, 9 Drawing Sheets

READ-ONLY MEMORY

BACKGROUND OF THE INVENTION

1. Field of the Invention

The present invention generally relates to read only memories (ROM) having the respective states of the cells are set on manufacturing of the integrated circuit containing the memory. The present invention more specifically relates to the forming of an array of memory cells formed of MOS transistors. It applies whether the programming of each cell is performed by the taking of a contact on one of the source or drain regions of the transistor (memory generally known as a "ROM contact"), or it is performed by the forming of a conductive via from a source or drain contact area to a metal track conveying the signals (memory generally known as a "ROM via").

2. Description of the Related Art

FIG. 1 very schematically shows in the form of blocks an example of a ROM of the type to which the present invention applies. Such a structure is intended to be made in integrated form, possibly with other components.

A ROM mainly comprises an array 1 of memory cells having word lines WL (for example, in rows) and bit lines BL (for example, in columns) respectively connected to row (ROWDEC) and column (COLDEC) decoding circuits 2 and 3, circuit 3 also comprising sense amplifiers (SA). Circuits 2 and 3 communicate with an input/output circuit 4 (ADD/DEC/I/O) also comprising an address decoder. Circuit 4 is connected to an address, data, and control bus 5, communicating with the outside of the memory.

FIGS. 2A and 2B partially and schematically show a conventional example of the architecture of an array 1 of ROM-type memory cells. FIG. 2A shows the equivalent electric diagram of the MOS transistors while FIG. 2B is a simplified top view of the active areas and of the overlying polysilicon and contact recovery metallization lines.

In the example of FIGS. 2A and 2B, eight memory cells distributed over two bit lines $BL_i$ and $BL_{i+1}$ and four word lines $WL_j$, $WL_{j+1}$, $WL_{j+2}$, and $WL_{j+3}$ have been shown. Each cell is formed of a MOS transistor having its gate g connected to a word line and having one of the source and drain regions s and d (for example, source s) grounded in a first metallization level of the structure. In FIG. 2B, the fact for a drain or source region d or s to be contacted by an upper metallization level has been illustrated by a point on the corresponding conductive line. As appears from this drawing, all the sources s of the transistors are shared by two transistors (and thus two memory cells) and are grounded by conductive lines parallel to the word lines. The transistor gates are formed in a polysilicon layer. To simplify the representation of the drawings, this polysilicon level has been voluntarily confounded with the word lines while in practice, these lines are formed in an upper metallization level and are connected to the gate regions by vias. The perpendicular bit and word lines are formed in two metallization levels above the cells.

The programming of each cell is performed by connecting or not the drain d of the involved transistor to the bit line of the corresponding cell. In the case where the drain is connected to the bit line, the memory cell is programmed to a low state. In the opposite case, it is programmed to a high state.

The reading of the memory cells of such an array is performed as follows. The bit line which must be read is precharged to a positive voltage level with respect to ground. Then, the memory cell to be read is addressed by means of the corresponding word line which turns on the cell transistor by application of a voltage on its gate. In the case where the bit line is connected to the transistor drain, the bit line discharges through the source of its grounded transistor and a low state is read by the amplifiers (3, FIG. 1). In the opposite case, the bit line is not discharged and provides a high state.

In FIG. 2B, it has been arbitrarily considered that the transistors of coordinates $WL_j$-$BL_{i+1}$, $WL_{j+1}$-$BL_i$, and $WL_{j+1}$-$BL_{i+1}$ were programmed to state zero (their drains are connected to the bit lines) while the other transistors are programmed to state one.

Other conventional example of a memory architecture are described in documents U.S. Pat. No. 6,556,468 and U.S. Pat. No. 6,363,001.

A problem of ROM cell arrays is linked to electromigration on the ground lines due to the significant number of cells likely to discharge the precharge current. When several parallel bit lines are precharged to the high level, the addressing of a word line to select the transistors of the corresponding intersections results in a discharge from the high state between the drain and the source of all the programmed transistors, to provide a zero value. The corresponding sum of the bit lines currents is then conveyed by the grounded conductive line. The intensity of the current to be conveyed by these grounded lines results either in oversizing said lines, and thus increasing the bulk, or in limiting the number of cells addressable in parallel in the memory plane, and thus the density.

Another disadvantage of ROM cells is due to the coupling between neighboring bit lines in the array. This phenomenon is due to the fact that, on precharge of the bit lines for reading the memory cells of a given word line, the discharge of a bit line having a grounded transistor of the addressed word line causes by coupling a decrease in the precharge voltage maintained on the neighboring line of a non-contacted transistor. This phenomenon is increased if the line on which a high state must be read is surrounded with two lines discharging to ground. This problem is more and more critical as memory cell arrays miniaturize and generates read errors.

A known solution to overcome this disadvantage is to differentially organize the reading of memory cells. Such a solution however requires be able to separately address two transistors of a same word line on two neighboring bit lines, which amounts to individualizing the word lines. This results in using two separate metallization levels to form the bit line conductors to be able to perform a plane-by-plane addressing. Such a solution has the disadvantage of decreasing the density of the structure. Further, it does not solve the problem of electromigration on ground conductors.

Another problem of known ROM architectures is due to the presence of shallow isolation trenches (STI) in the integrated structure to separate the transistors forming the cells.

FIG. 3 illustrates this problem in a very simplified cross-section view along a bit line of an N-channel MOS transistor structure on a P substrate, used for a ROM cell array. To simplify, the contact areas on the conductive lines have not been shown.

The transistors are formed in pairs (with a common source s) and the respective drains d of two transistors of a same pair are separated from the drains of the transistors of the neighboring pairs by means of STI shallow isolation trenches in both directions. This amounts to forming two transistors per well defined by means of isolation trenches. The size of such isolation trenches generates a physical stress on the transistors. Now, the greater this stress, the lower the current for given dimensions (gate width and length). This problem results in increasing the respective transistor sizes.

BRIEF SUMMARY OF THE INVENTION

One embodiment of the present invention overcomes all or part of the disadvantages of conventional ROM cell architectures.

One embodiment of the present invention distributes the ground current of several simultaneously-read cells.

One embodiment of the present invention provides a ROM cell architecture solving the problems of coupling between bit lines.

One embodiment of the present invention decreases the physical stress linked to the isolating trenches of the structure.

One embodiment of the present invention provides a solution compatible with contact-type memories and via-type memories.

One embodiment of the present invention provides an array of ROM cells each formed of a transistor having a first drain or source region connected to a bit line connecting several transistors in a first direction, the gates of the different transistors being connected to word lines in a second direction perpendicular to the first one, the array comprising a repetition of an elementary pattern extending over three lines in each direction and comprising nine transistors arranged so that each of the lines of the elementary pattern comprises two cells, two neighboring transistors of each pattern in the first direction sharing a same second region connected to a ground line and being connected to different bit lines from a word line to the other.

According to an embodiment of the present invention, the state of a cell depends on the forming or not of a connection between the region of its transistor connected to ground and the bit line.

One embodiment of the present invention also provides a ROM comprising an array of cells, at least one of the ends of a group of three columns of the elementary pattern being connected to a read device for selecting, from among the three bit lines, two bit lines to be read from the addressed word line.

According to an embodiment of the present invention, groups of memory cells are arranged in columns, by being connected so that the first bit line of the first group is connected to the third bit line of the second group, the second bit line of the first group is connected to the first bit line of the second group, and the third bit line of the first group is connected to the second bit line of the second group, a first column of groups comprising such connections vertically every three groups while a second neighboring column comprises such a connection between each group.

According to an embodiment of the present invention, the ground connection of the first regions is performed in a first metallization level while the bit lines are formed in a second metallization level, the connections between the first and third bit lines between groups being formed in a third metallization level.

The foregoing and other features and advantages of the present invention will be discussed in detail in the following non-limiting description of specific embodiments in connection with the accompanying drawings.

DETAILED DESCRIPTION OF THE INVENTION

Figure 1:
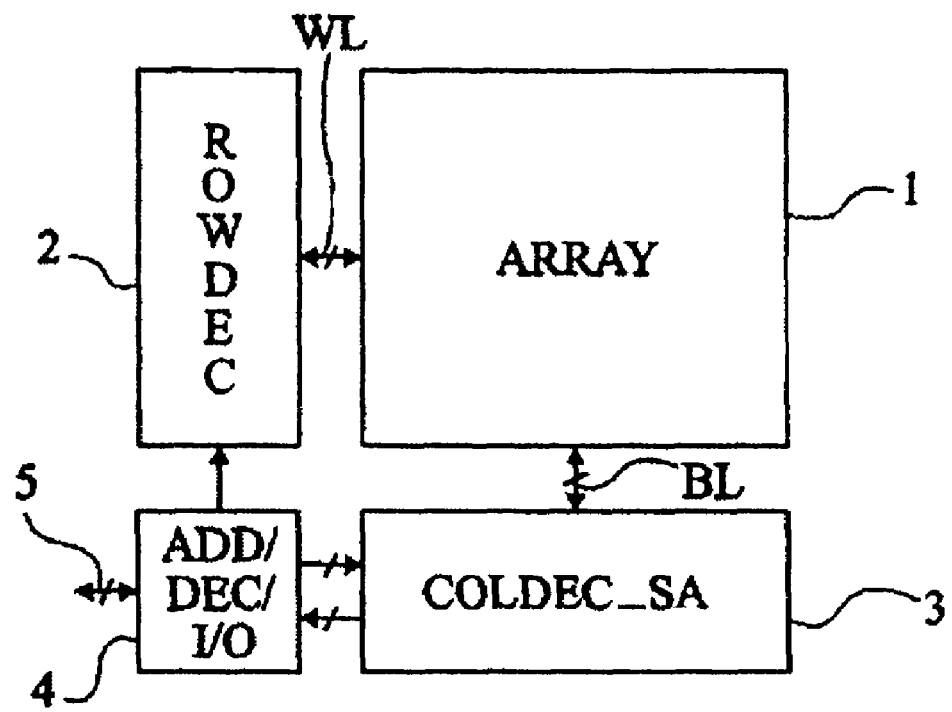
FIG. 1, previously described, very schematically shows in the form of blocks an example of a ROM of the type to which the present invention applies.

Same elements have been designated with same reference numerals in the different drawings. For clarity, only those elements useful to the understanding of the present invention have been shown in the drawings and will be described hereafter. In particular, the circuits for reading and addressing the memory cells of an array according to the present invention have not been discussed.

Figure 2A:
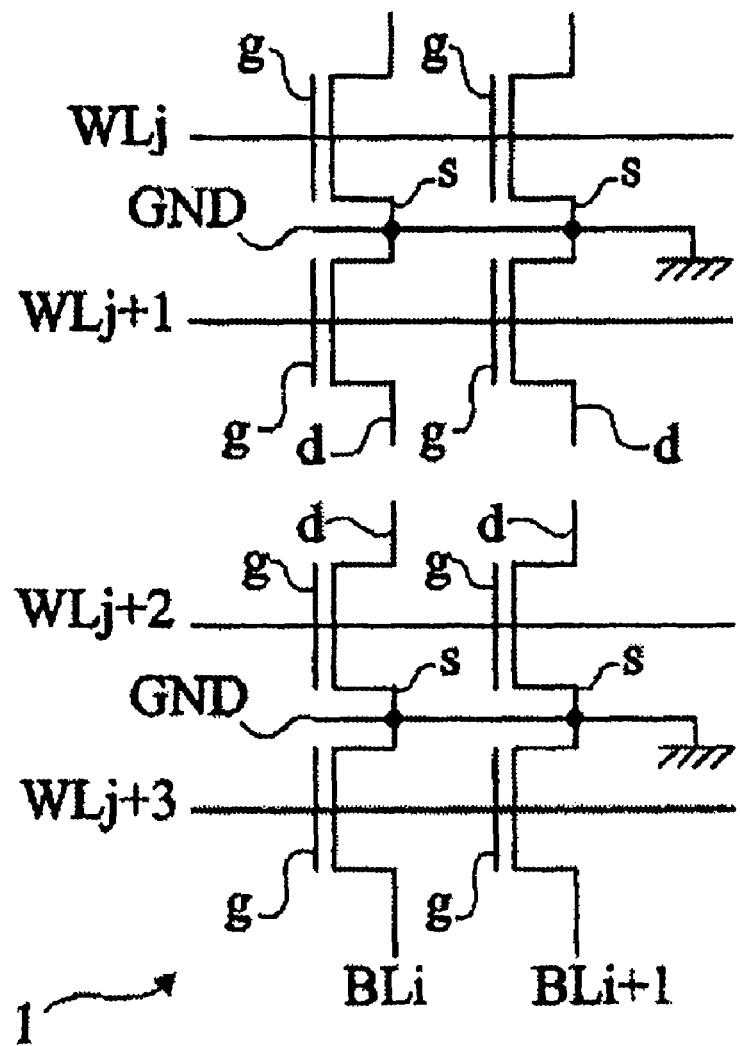
FIGS. 2A and 2B, previously described, show an example of a conventional ROM cell array architecture.
Figure 2B:
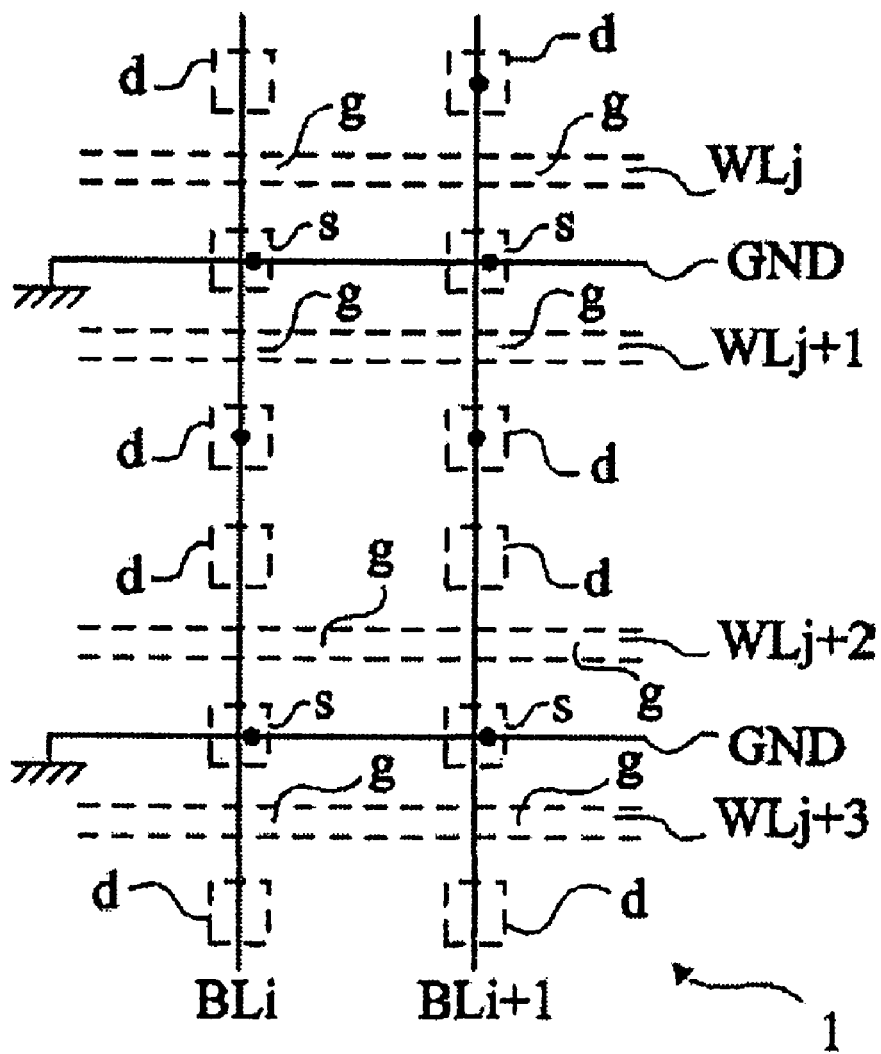
Figure 4A:
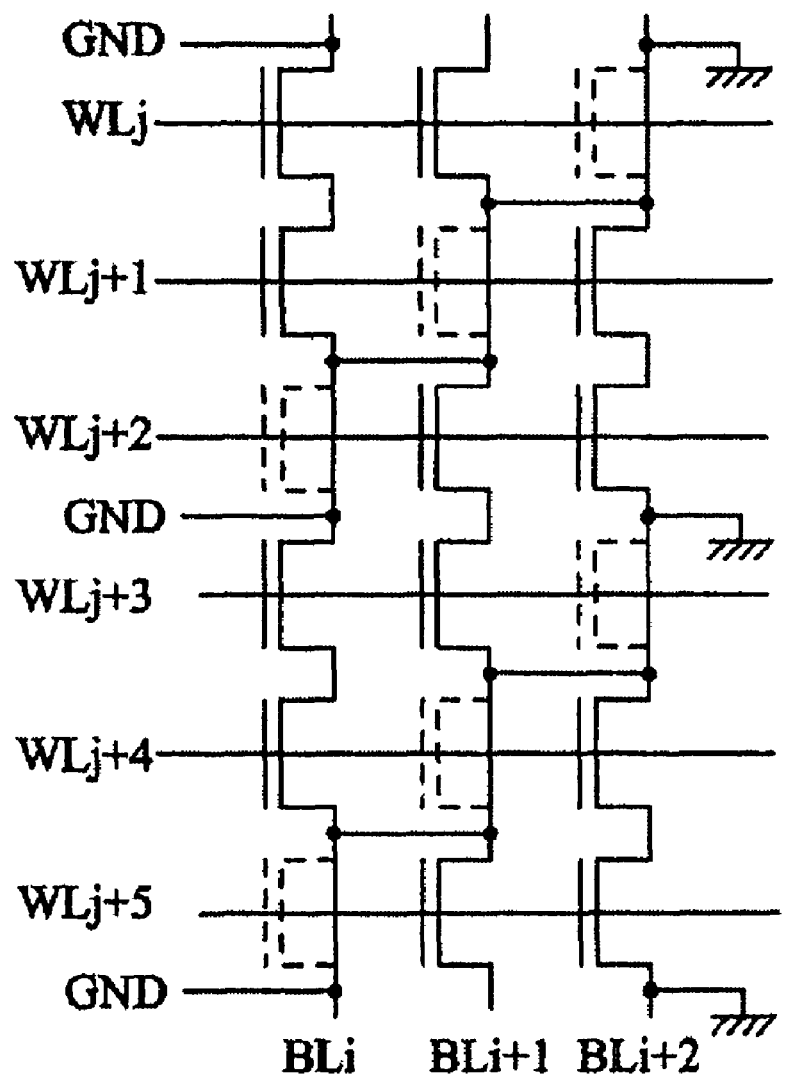
FIGS. 4A and 4B partially show an embodiment of a memory cell array according to the present invention.
Figure 4B:
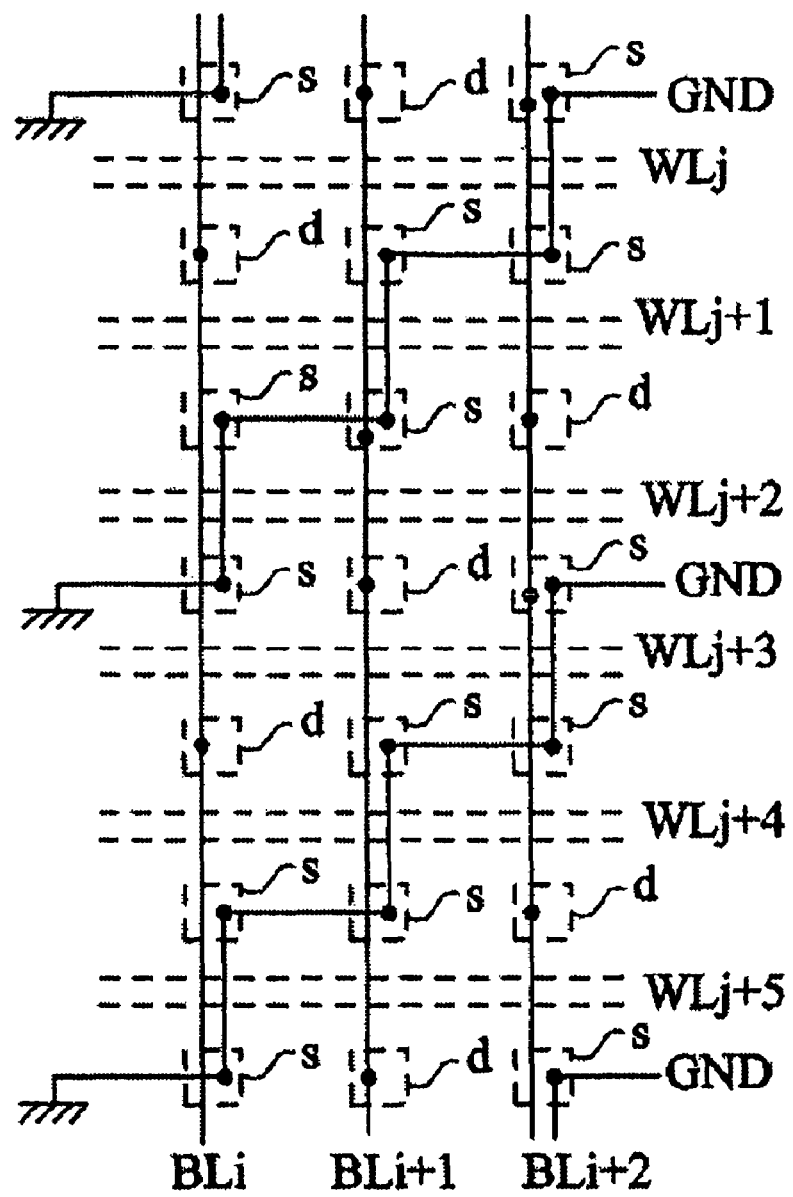

FIGS. 4A and 4B very schematically show an embodiment of a ROM cell array according to the present invention. These drawings should be compared with previously-described FIGS. 2A and 2B, and respectively illustrate the equivalent electric diagram of the memory cell array and a simplified top view of the corresponding integrated circuit.

As previously, each cell is formed of a MOS transistor (for example, with an N channel) having its programmed or not state depending on the transfer of a contact from a drain or source region to a conductive line (bit line) to condition the discharge to ground of a precharge voltage of this line. However, conversely to conventional structures, this programming is performed on the region connected to a ground line.

In the example shown in FIGS. 4A and 4B, the respective sources s of the different transistors are connected to ground (GND) in a first metallization level. A difference with known structures is that this ground connection of the different sources is performed diagonally with respect to word lines $WL_j$ and to bit lines $BL_i$. This amounts to providing, every two transistors in the bit line direction, a transistor having its two regions interconnected by the ground conductive line and thus having as only object to interconnect sources s of the two neighboring transistors. In FIG. 4A, these transistors are shown in dotted lines. In the other direction (parallel to the word lines), the ground conductive line interconnects the neighboring (common) sources of two neighboring transistors. Stepped ground conductive lines having parallel general directions are obtained in the array diagonal.

A memory according to this embodiment of the present invention is thus formed of the repetition of an elementary pattern extending over three bit lines and over three word lines (three rows and three columns). This pattern comprises six memory cells (six MOS transistors forming the memory points) distributed at the intersections of the rows and columns so that each of the three rows and each of the three columns of the elementary pattern comprises two cells only. In the example shown in FIGS. 4A and 4B, line $WL_j$ comprises memory cells at the intersections of bit lines $BL_i$ and $BL_{i+1}$, line $WL_{j+1}$ comprises cells at the intersections of lines $BL_i$ and $BL_{i+2}$, and line $WL_{j+2}$ comprises cells at the intersections of columns $BL_{i+1}$ and $BL_{i+2}$. This pattern is repeated for the next three rows $WL_{j+3}$, $WL_{j+4}$, and $WL_{j+5}$. It is also repeated in the other direction (not shown) by groups of three bit lines.

The programming of the memory points of an architecture according to one embodiment of the present invention is performed no longer by contacting drains d of the different transistors which are here all connected to the bit lines to which they correspond, but by contacting source s of the corresponding transistor to the bit line. This amounts to connecting or not the source terminal of the involved transistor connected to the metallization line (bit line) to the ground line via this source contact. If this contact is made, the addressing of the corresponding transistor will cause the discharge to ground of the precharge voltage. In the opposite case, this precharge voltage will be maintained. In the example of FIG. 4B, it is assumed that the transistors of the cells formed at the intersections of line $WL_j$ with column $BL_{i+2}$ and of line $WL_{j+2}$ with columns $BL_{i+1}$ and $BL_{i+2}$ are programmed to state zero. This is illustrated by points on the corresponding bit lines, at the level of the sources of these transistors.

To simplify the representation of FIG. 4B, bit lines BL have been shown parallel to the conductive sections contacting, in the bit line directions and two transistors out of three, the sources of two neighboring transistors. In practice, these lines and sections are formed in different metallization levels. For example, the ground lines are formed in a first metallization level while the bit lines are formed in a second metallization level. Word lines WL illustrated in a dielectric level for forming gate regions are of course recovered in an higher metallization level to perform the addressing.

According to an alternative embodiment, the drains and sources are inverted. The contact which is not shared with the neighboring cell of the bit line is then used to perform the programming.

The reading of the memory cells of such an architecture is performed by groups of three bit lines in each of which only two lines are effectively read. The third one of the lines is not addressed (transistors with short-circuited regions) and thus keeps its voltage (preferably, the precharge level). It can be considered that it is used as a reference line for the reading of the two others. According to the addressed word line, the bit line used as a reference line changes every three lines. By the repetition of the pattern in the word line direction, each read bit line is surrounded with another read line and with a line having its level remaining, during this reading, at a fixed voltage.

An advantage of the embodiment of the present invention shown in FIGS. 4A, 4B is that it enables balancing the currents on the different ground conductors due to the diagonal arrangement of these conductors. Indeed, since two word lines are not addressed at the same time, the addressed cells of the bit lines corresponding to the intersection with the word line all belong to different ground conductors. Accordingly, each ground conductor only conveys the current of a cell, which enables reducing the size thereof.

According to a first embodiment, the cell reading is performed by means of differential amplifiers, the two inputs of which receive the output of three-to-two multiplexers to select, each time, a reference line and a data line. A same reference line is used by two data lines and is thus shared by two amplifiers.

Figure 5A:
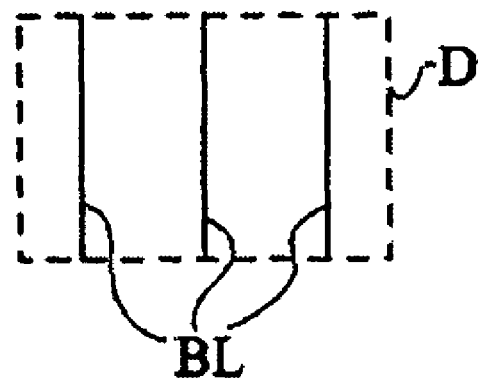
FIGS. 5A, 5B, and 5C very schematically illustrate in the form of blocks the association of several groups of cells according to an embodiment of the present invention.
Figure 5B:
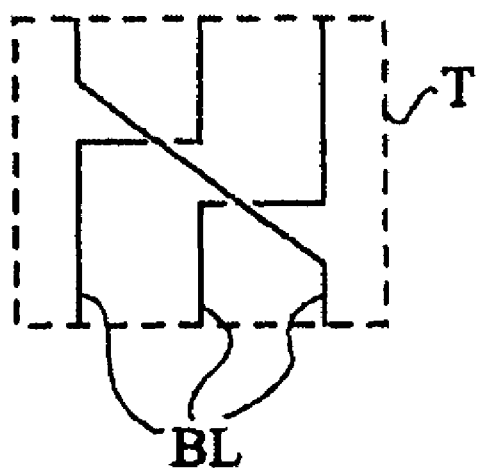
Figure 5C:
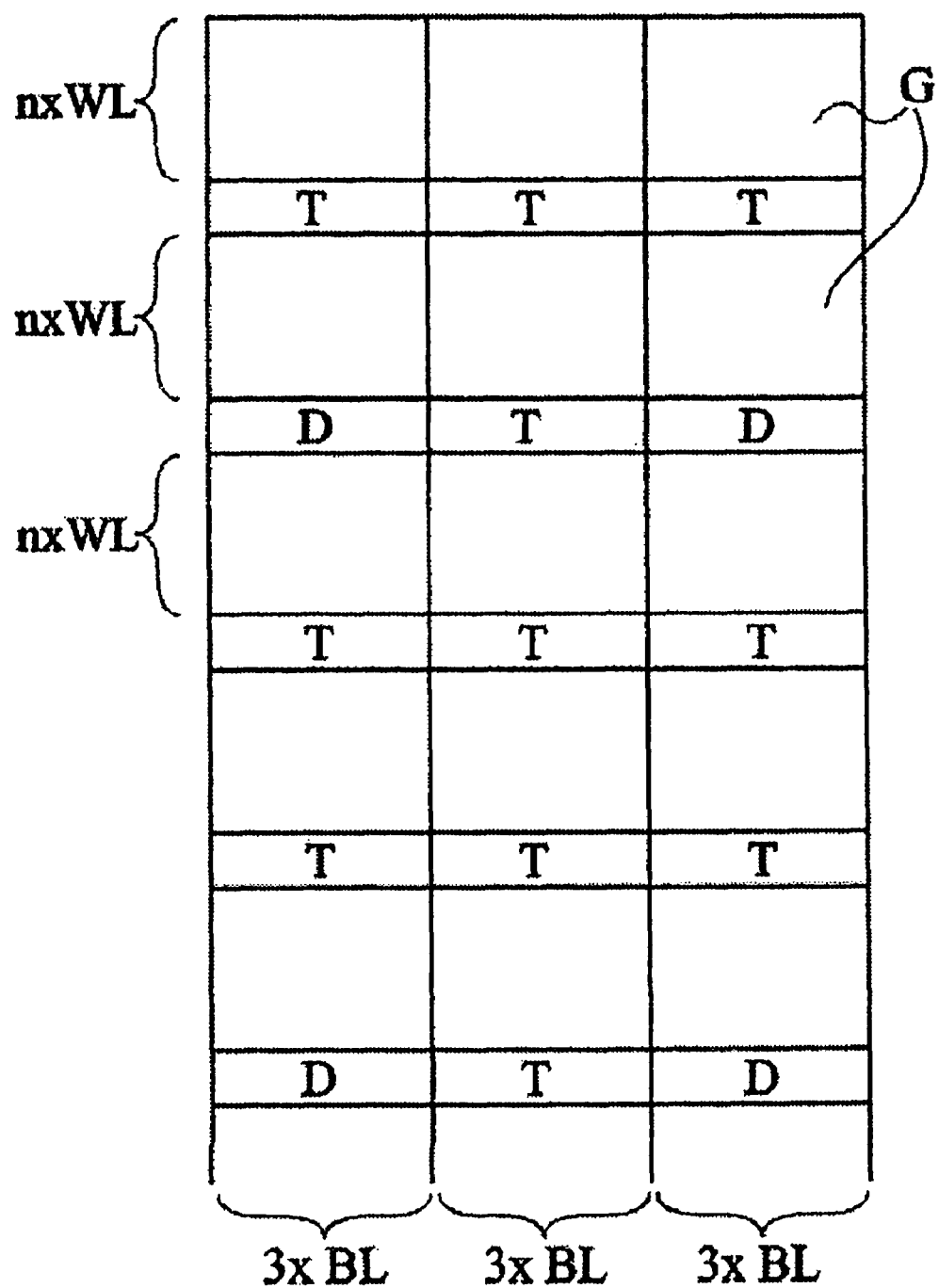

FIGS. 5A, 5B, and 5C very schematically show in the form of blocks a preferred example of the organization of memory cells in groups to balance the coupling between the different bit lines. The cells are gathered in groups G of memory cells of the type described in relation with FIGS. 4A and 4B. Each group G comprises three adjacent bit lines BL and any number n of word lines WL. Groups G are connected vertically two-by-two (in the bit line direction), either with no crossing (block D, FIG. 5A) of bit lines BL, or with a crossing (block T, FIG. 5B) of bit lines BL such that the first one of the three lines becomes the last one, the second one becomes the first one, and the third one becomes the second one. As illustrated in FIG. 5C, one group column out of two, all the blocks are connected by an inversion of the bit line connections (block T) while in the other group columns, the vertical connection is not modified (connection D) one block out of three.

With such an architecture, the couplings between the different bit lines are balanced in the memory plane. Indeed, each reference bit line will equitably couple the two neighboring lines as well as the lines of previous and next triplets in the word line direction.

An advantage of the present invention according to this preferred embodiment is that it solves not only electromigration problems, but also coupling problems.

Another advantage of the embodiment discussed above is that the provided architecture enables reducing the number of STI isolation trenches between MOS transistors, which enables decreasing the physical stress in the structure and, accordingly, reducing the size for a given current.

Figure 3:
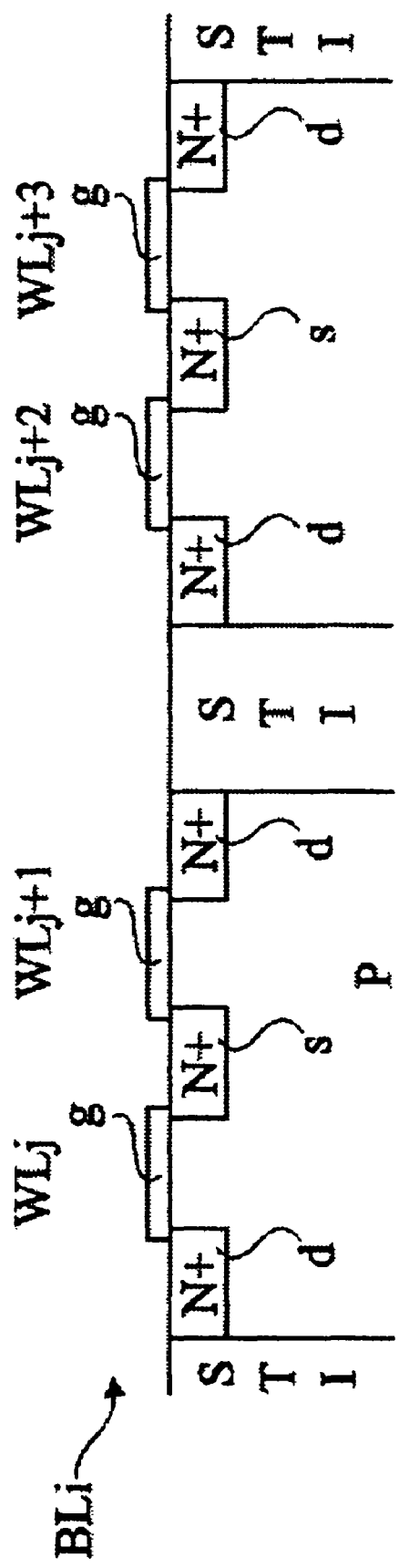
FIG. 3, previously described, is a very simplified partial cross-section view of MOS transistors of a conventional memory cell array.
Figure 6:
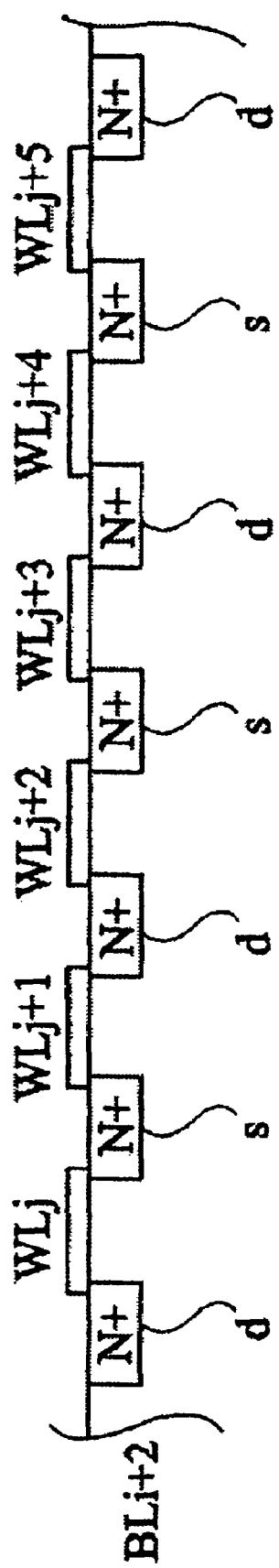
FIG. 6 is a simplified cross-section view of MOS transistors forming a memory cell array according to an embodiment of the present invention.

This advantage is illustrated in FIG. 6 which shows, in a simplified partial view to be compared with that of FIG. 3, an example of a cross-section of an integrated circuit comprising MOS transistors for forming a memory according to an embodiment of the present invention.

As illustrated in this drawing, no isolation trench is necessary in the bit line direction. In the shown example, the case of line $BL_{i+2}$ is considered. Word lines $WL_j$ and $WL_{j+1}$ share their source s, lines $WL_{j+1}$ and $WL_{j+2}$ share their drain, etc. Isolation trenches are used in the other direction to separate the bit lines from one another.

Of course, the present invention is likely to have various alterations, modifications, and improvements which will occur to those skilled in the art. In particular, although the present invention has been more specifically described in relation with a contact-type memory, it also applies to a via-type memory in which the programming selection is performed by vias connecting metallization lines to the contact areas of the integrated circuit. Further, the adaptation of the column and row decoders, as well as of the sense amplifiers, to have them share a same reference line is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A read-only memory (ROM), comprising:
an array of ROM cells, each formed of a transistor having a first drain or source region connected to a bit line connecting several transistors in a first direction, the transistors of the ROM cells having respective gates connected to word lines in a second direction that is at an angle to the first direction, the array comprising a repetition of an elementary pattern extending across three bit lines in each direction and comprising nine transistors forming six memory cells arranged so that each of the word lines of the elementary pattern comprises exactly two memory cells across the three bit lines, two neighboring transistors of each elementary pattern in the first direction on each bit line sharing a same second drain or source region via a third transistor having its drain shorted to its source and connected to a ground line that is connected in a diagonal direction to the three bit lines from one word line to another word line.

2. The ROM of claim 1, wherein each of the cells has a state that depends on whether a connection exists between the second drain or source region of its transistor and the bit line to which the first drain or source region of the transistor is connected.

3. The ROM of claim 1, further comprising a read device connected to an end of a group of three columns of the elementary pattern, the read device structured to select, from among three bit lines, two bit lines to be read from an addressed word line.

4. The ROM of claim 3, wherein the ROM cells include first and second columns of groups of ROM cells, the groups of the first column including first and second groups each with first, second, and third bit lines, the first bit line of the first group being connected to the third bit line of the second group, the second bit line of the first group being connected to the first bit line of the second group, and the third bit line of the first group being connected to the second bit line of the second group, the first column of groups comprising such connections vertically two among three groups while the second column comprises such connections between each group.

5. The ROM of claim 4, wherein the second drain or source region is connected to the ground line by ground connection in a first metallization level, the bit lines are formed in a second metallization level, and the connections between the first and third bit lines between groups being formed in a third metallization level.

6. A memory device, comprising:
an array of transistors arranged in rows across a plurality of columns, each transistor having a gate, a drain region, and source region, wherein a plurality of the transistors in each column of the array of transistors are shorted in a regular pattern, each shorted transistor having its drain and its source region electrically connected to one another, the array comprising conductive lines coupled to the shorted transistors across the columns.

7. The memory device of claim 6 wherein the array includes a plurality of sub-arrays each including three rows of transistors and three columns of transistors, each sub-array including three of the shorted transistors, each row of each sub-array including one of the shorted transistors, and each column of each sub-array including one of the shorted transistors.

8. The memory device of claim 7 wherein the lines connecting the shorted transistors comprise a single line in each sub-array that is connected to ground connection line.

9. The memory device of claim 6, further comprising:
a plurality of bit lines extending respectively along the columns of the array and coupled to the conductive lines, wherein each of a first plurality of the transistors has a first logic state because both of the source and drain regions of the transistor is electrically connected to one of the bit lines, and each of a second plurality of transistors has a second logic state because at least one of the source and drain regions of the transistor is not electrically connected to one of the bit lines.

10. The memory device of claim 6, further comprising:
a plurality of bit lines extending respectively along the columns of the array and coupled to the conductive lines, wherein one of the columns includes a first group of transistors connected to a first one of the bit lines, a second group of transistors connected to a second one of the bit lines, and a third group of transistors connected to a third one of the bit lines.

11. The memory device of claim 6 wherein the transistors include first and second columns of groups of transistors, the groups of the first column including first, second, and third groups each with first, second, and third bit lines, the first bit line of the first group being connected to the third bit line of the second group, the second bit line of the first group being connected to the first bit line of the second group, and the third bit line of the first group being connected to the second bit line of the second group, the first column of groups comprising such connections vertically every three groups while the second column comprises such connections between each group.

12. The memory device of claim 11, wherein each source region is connected to a ground line by a ground connection in a first metallization level, the bit lines are formed in a second metallization level, and the connections between the first and third bit lines between groups are formed in a third metallization level.

13. A memory device, comprising:
an array of transistors arranged in first and second directions, the array including a plurality of patterns of memory cells, each pattern comprising nine transistors including three lines of transistors in the first direction and three lines of transistors in the second direction to form six memory cells, wherein the transistors of each of the lines include a shorted transistor and two non-shorted transistors that form two memory cells, each shorted transistor having its source region connected to its drain region, the shorted transistors of each pattern are connected to one another via a ground connection line across the second direction.

14. The memory device of claim 13, wherein the transistors of the memory cells each include source and drain regions, the memory device further comprising:
a plurality of bit lines extending respectively along columns of the array, wherein each of a first plurality of the memory cells has a first logic state because both of the source and drain regions of the transistor of the memory cell are electrically connected to one of the bit lines, and each of a second plurality of the memory cells has a second logic state because at least one of the source and drain regions of the transistor of the memory cell is not electrically connected to one of the bit lines.

15. The memory device of claim 13, further comprising:
a plurality of bit lines extending respectively along columns of the array, wherein one of the columns includes a first group of transistors connected to a first one of the bit lines, a second group of transistors connected to a second one of the bit lines, and a third group of transistors connected to a third one of the bit lines.

16. The memory device of claim 13 wherein the transistors include first and second columns of groups of transistors, the groups of the first column including first, second, and third groups each with first, second, and third bit lines, the first bit line of the first group being connected to the third bit line of the second group, the second bit line of the first group being connected to the first bit line of the second group, and the third bit line of the first group being connected to the second bit line of the second group, the first column of groups comprising such connections vertically every three groups while the second column comprises such connections between each group.

17. The memory device of claim 16, wherein each of the transistors of the first and second columns includes a first drain or source region connected to one of the bit lines and a second drain or source region connected to a ground line by a ground connection in a first metallization level, wherein the bit lines are formed in a second metallization level and the connections between the first and third bit lines between groups are formed in a third metallization level.

18. A memory device, comprising:
an array of transistors arranged in rows and columns, each transistor having a gate, a drain region, and source region, wherein a plurality of the transistors in each column are shorted in a regular pattern, each shorted transistor having its drain region connected to its source region;
a plurality of bit lines extending respectively along the columns of the array, wherein each of a first plurality of the transistors has a first logic state because one of the source and drain regions of the transistor are electrically connected to one of the bit lines, and each of a second plurality of transistors has a second logic state because at least one of the source and drain regions of the transistor is not electrically connected to one of the bit lines; and
a plurality of ground lines connected to the shorted transistors across a plurality of bit lines.

19. The memory device of claim 18, wherein the transistors include first and second columns of groups of transistors, the groups of the first column including first, second, and third groups each with first, second, and third bit lines, the first bit line of the first group connected to the third bit line of the second group, the second bit line of the first group connected to the first bit line of the second group, and the third bit line of the first group connected to the second bit line of the second group, the first column of groups comprising such connections vertically every three groups while the second column comprises such connections between each group.

20. The device of claim 18, wherein each source region is connected to a ground line by a ground connection in a first metallization level, the bit lines are formed in a second metallization level, and the connections between the first and third bit lines between groups are formed in a third metallization level.

21. A memory device, comprising:
an array of transistors arranged in rows and columns, each transistor having a gate, a drain region, and source region, wherein a plurality of the transistors in each row are shorted in a regular pattern and a plurality of the transistors in each column are shorted in a regular pattern, each shorted transistor having its drain and its source regions electrically connected to one another; and
wherein the transistors include first and second columns of groups of transistors, the groups of the first column including first, second, and third groups each with first, second, and third bit lines, the first bit line of the first group connected to the third bit line of the second group, the second bit line of the first group connected to the first bit line of the second group, and the third bit line of the first group connected to the second bit line of the second group, the first column of groups comprising such connections vertically every three groups while the second column comprises such connections between each group.

22. The memory device of claim 21, wherein each source region is connected to a ground line by a ground connection in a first metallization level, the bit lines are formed in a second metallization level, and the connections between the first and third bit lines between groups are formed in a third metallization level.

23. A memory device, comprising:
an array of transistors arranged in first and second directions, the array including a plurality of patterns of memory cells, each pattern comprising nine transistors including three lines of transistors in the first direction and three lines of transistors in the second direction to form six memory cells, wherein the transistors of each of the lines include a shorted transistor and two non-shorted transistors that form two memory cells, each shorted transistor having its source region connected to its drain region; and
wherein the transistors include first and second columns of groups of transistors, the groups of the first column including first, second, and third groups each with first, second, and third bit lines, the first bit line of the first group connected to the third bit line of the second group, the second bit line of the first group connected to the first bit line of the second group, and the third bit line of the first group connected to the second bit line of the second group, the first column of groups comprising such connections vertically every three groups while the second column comprises such connections between each group.

24. The memory device of claim 23, wherein each of the transistors of the first and second columns includes a first drain or source region connected to one of the bit lines and a second drain or source region connected to a ground line by a ground connection in a first metallization level, wherein the bit lines are formed in a second metallization level and the connections between the first and third bit lines between groups are formed in a third metallization level.

* * * * *

UNITED STATES PATENT AND TRADEMARK OFFICE
CERTIFICATE OF CORRECTION

PATENT NO. : 7,447,074 B2  Page 1 of 1
APPLICATION NO. : 11/481576
DATED : November 4, 2008
INVENTOR(S) : Francois Jacquet It is certified that error appears in the above-identified patent and that said Letters Patent is hereby corrected as shown below:

Column 7
Line 36, "and source region, wherein a plurality of the transistors" should read as
-- and a source region, wherein a plurality of the transistors --

Line 50, "The memory device of claim 7 wherein the lines" should read as -- The memory device of claim 7 wherein the conductive lines --

Line 52, "sub-array that is connected to ground connection line" should read as
-- sub-array that is connected to a ground connection line --

Lines 56-59, "a first logic state because both of the source and drain regions of the transistor is electrically connected to one of the bit lines" should read as -- a first logic state because both of the source and drain regions of the transistor are electrically connected to one of the bit lines --

Column 9
Lines 7-8, "and source region, wherein a plurality of the transistors" should read as
-- and a source region, wherein a plurality of the transistors --

Lines 14-15, "because one of the source and drain regions of the transistor are electrically" should read as -- because one of the source and drain regions of the transistor is electrically --

Lines 41-42, "and source region, wherein a plurality of the transistors" should read as
-- and a source region, wherein a plurality of the transistors --

Signed and Sealed this

Tenth Day of March, 2009

JOHN DOLL
*Acting Director of the United States Patent and Trademark Office*